United States Patent [19]
Lee

[11] Patent Number: 6,060,382
[45] Date of Patent: *May 9, 2000

[54] METHOD FOR FORMING INSULATING FILM BETWEEN METAL WIRINGS OF SEMICONDUCTOR DEVICE

[75] Inventor: Seung Moo Lee, Kyoungki-do, Rep. of Korea

[73] Assignee: Hyundai Electronics Industries Co., Ltd., Ichon-shi, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/660,151

[22] Filed: Jun. 4, 1996

[30] Foreign Application Priority Data

Jun. 28, 1995 [KR] Rep. of Korea .................. 95-17677

[51] Int. Cl.[7] .................. H01L 21/306; H01L 21/4763
[52] U.S. Cl. .................. 438/622; 438/636; 438/643; 438/653
[58] Field of Search .................. 438/618, 622, 438/636, 643, 653

[56] References Cited

U.S. PATENT DOCUMENTS

| | | | |
|---|---|---|---|
| 5,089,442 | 2/1992 | Olmer | 438/631 |
| 5,403,780 | 4/1995 | Jain et al. | 438/624 |
| 5,444,023 | 8/1995 | Homma | 438/631 |
| 5,643,834 | 7/1997 | Harada et al. | 438/122 |

FOREIGN PATENT DOCUMENTS

| | | |
|---|---|---|
| 1-124221 | 5/1989 | Japan . |
| 6-132542 | 5/1994 | Japan . |
| 7-115135 | 5/1995 | Japan . |
| 7-142471 | 6/1995 | Japan . |

Primary Examiner—John F. Niebling
Assistant Examiner—Ha Tran Nguyen
Attorney, Agent, or Firm—Jacobson, Price, Holman & Stern, PLLC

[57] ABSTRACT

A method for forming metal wirings, which includes the steps of forming over an insulating film a conduction pattern corresponding to metal wirings, which will be subsequently formed, plasma-treating the surface of the resulting structure, forming an oxide film, which contains Si atoms with a refraction index of 1.47 or above in an excessive amount, using $SiH_4$—$N_2O$ mixed gas, and forming an $O_3$-TEOS film over the oxide film. In accordance with this method, it is possible to prevent a formation of voids in the insulating layer and a degradation in the quality of the insulating layer while achieving a superior reproducibility, an improved yield and an improved reliability.

7 Claims, 3 Drawing Sheets

METHOD FOR FORMING INSULATING FILM BETWEEN METAL WIRINGS OF SEMICONDUCTOR DEVICE

BACKGROUND OF THE INVENTION

1. Field of the Invention

The present invention relates to a method for forming an insulating film between metal wirings of a semiconductor device, and more particularly to a method for forming an insulating film between metal wirings of a semiconductor device, which involves treating a patterned surface of a semiconductor substrate using plasma, forming a first inter-metal insulating film on the plasma-treated substrate surface in accordance with a plasma enhanced chemical vapor deposition (PECVD) method, and then forming an $O_3$-tetra ethyl ortho silicate (TEOS) film on the insulating film.

2. Description of the Prior Art

An increase in the integration degree of semiconductor devices results in a reduction in the width of conduction wirings such as gate electrodes or bit lines. As such conduction wirings have a reduced width, their electrical resistance increases correspondingly. For example, if the width of a conduction wiring is reduced by a time of 1/N, the electrical resistance generated at the conduction wiring increases by N times. Such an increase in electrical resistance results in a decrease in the operating speed of the semiconductor device.

For conduction wirings used as gate or bit lines of semiconductor devices, doped polysilicon layers are typically used. However, such doped polysilicon layers exhibit a high surface resistance of about 30 to 70 $\Omega/cm^2$ and a high contact resistance of about 30 to 70 $\Omega/cm^2$ per contact.

Such high surface and contact resistances serve to decrease the operating speed of the semiconductor device. In order to decrease such resistances, a selective metal film deposition method has been proposed, which provides a silicide, namely, self-aligned silicide structure consisting of a metal-silicide film formed over a polysilicon layer. In accordance with this method, a metal silicide film or selective metal film is formed only over the conduction wiring.

For example, where a titanium silicide or selective tungsten layer is formed over a polysilicon layer pattern, it is possible to considerably reduce the surface resistance to about 5 $\Omega/cm^2$ and the contact resistance to about 3 $\Omega/cm^2$ or below per contact. Accordingly, a lengthened operating time of semiconductor devices is obtained. It is also possible to achieve a high integration of semiconductor devices.

Typically, aluminum or an alloy thereof is used to form metal wirings. In order to obtain an improved characteristic, the use of tungsten has also been proposed. As compared to aluminum, tungsten exhibits a superior stability at a high temperature, provides a thin metal wiring and achieves an easy planarization.

Referring to FIGS. 1A to 1C, a conventional method for forming an insulating film between metal wirings of a semiconductor device is illustrated. For convenience of description, the metal wirings will be described as consisting of tungsten.

In accordance with this method, a semiconductor substrate (not shown) is first prepared, which is provided with an elementisolating oxide film to define an active region. The semiconductor substrate is also provided with MOS transistors, capacitors and bit lines. Over the entire surface of the semiconductor substrate, an insulating film 1 is then formed, as shown in FIG. 1A.

On the insulating film 1, a Ti layer 2 and a TiN layer 3 are sequentially formed to form a barrier metal layer. A tungsten (W) layer 4 is then deposited over the TiN layer 3 in accordance with the well-know chemical vapor deposition (CVD) method. Thereafter, an anti-reflection film 5 made of TiN is formed over the W layer 4. The anti-reflection film 5 serves to prevent an irregular reflection phenomenon occurring when the W layer is subsequently exposed to light for its patterning.

Thereafter, the resulting structure is wet or dry-etched from the anti-reflection film 5 to the Ti layer 2 in a sequential manner in accordance with the well-known photo-etching method, thereby forming metal wirings consisting of the conduction patterns from the pattern of the anti-reflection film 5 to the pattern of the Ti layer 2.

Over the entire surface of the resulting structure, an oxide film 6 is formed to a thickness of about 1,000 Å in accordance with the well-known CVD method, as shown in FIG. 1B. The oxide film 6 is then exposed at its surface to Ar or $N_2$ gas plasma, thereby causing the surface to be damaged while generating charge. This step is carried out to achieve an improvement in the interface characteristic of the oxide film 6 with a planarizing layer which will be subsequently formed.

An $O_3$-TEOS film 7 is then formed over the surface-damaged oxide film 6, as shown in FIG. 1C. In order to provide a planarized surface, the material of the $O_3$-TEOS film 7 flows. Thus, an insulating film between metal wirings is formed.

As mentioned above, the conventional method involves the steps of forming an oxide film over metal wirings, plasma-treating the surface of the oxide film, thereby damaging the oxide film surface, and forming an $O_3$-TEOS film as a planarizing film over the surface-damaged oxide film. However, the $O_3$-TEOS film is grown at a growth rate varying depending on the kind or condition of the under layer disposed therebeneath because it exhibits a high dependency on the under layer. In some cases, the $O_3$-TEOS film may have a plurality of voids or exhibit a degraded flowability and reproducibility. As a result, the conventional method has problems such as a degraded yield and reliability.

Where the metal wirings consist of tungsten in place of aluminum, the growth rate of the $O_3$-TEOS film decreases greatly, thereby resulting in a degradation in the quality of the film.

SUMMARY OF THE INVENTION

Therefore, an object of the invention is to solve the above-mentioned problems involved in the prior art and to provide a method for forming an insulating film between metal wirings of a semiconductor device, which involves forming patterned metal wirings on an insulating film, treating the entire surface of the resulting structure using plasma, and then forming a CVD oxide film and an $O_3$-TEOS film over the plasma-treated surface of the structure, thereby preventing a formation of voids in the insulating layer and a degradation in the quality of the insulating layer while achieving a superior reproducibility, an improved yield and an improved reliability.

In accordance with the present invention, this object is accomplished by providing a method for forming an insulating film between metal wirings of a semiconductor device, comprising the steps of: forming an insulating film over a semiconductor substrate; forming metal wirings on said insulating film; plasma-treating said metal wirings;

forming an oxide film, which contains silicon in an excessive amount, over the entire exposed surface of the resulting structure obtained after said plasma treatment; and forming an $O_3$-tetra ethyl ortho silicate film over said oxide film.

In accordance with the present invention, the insulating film formed over the semiconductor substrate may be comprised of an oxide film or a boro phospho silicate glass film. The plasma treatment may be carried out using $N_2$ gas plasma. The formation of the oxide film containing silicon in an excessive amount may be carried out using $SiH_4$—$N_2O$ mixed gas in accordance with a plasma enhanced chemical vapor deposition method so that the oxide film can have a refraction index of not less than 1.47.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
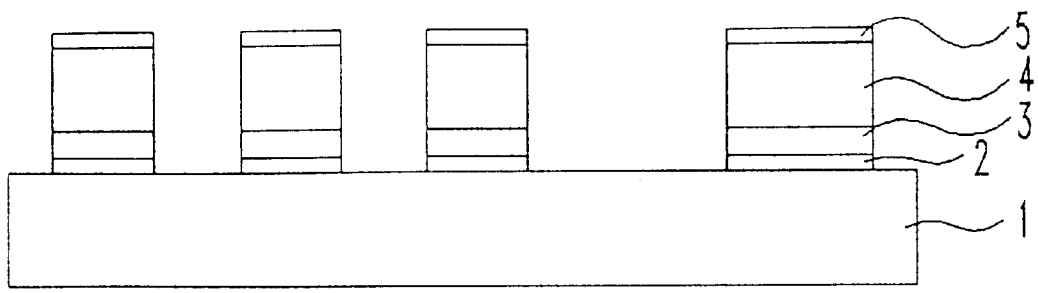
FIGS. 1A to 1C are sectional views respectively illustrating a conventional method for forming an insulating film between metal wirings of a semiconductor device.
Figure 1B:
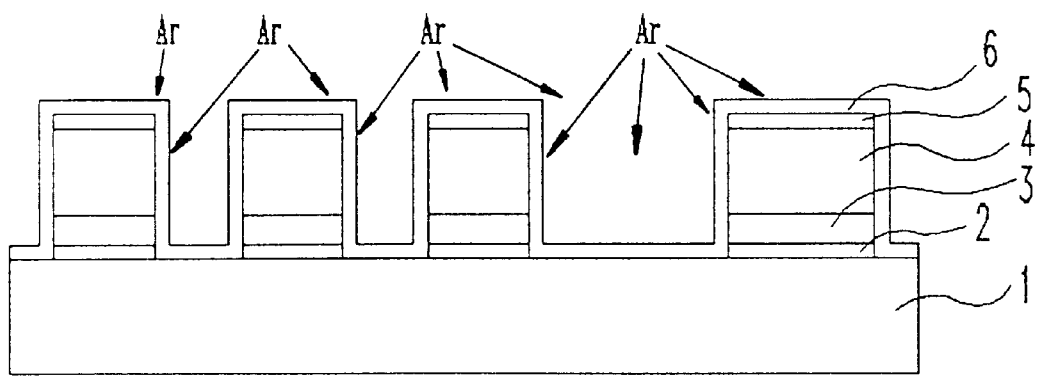
Figure 1C:
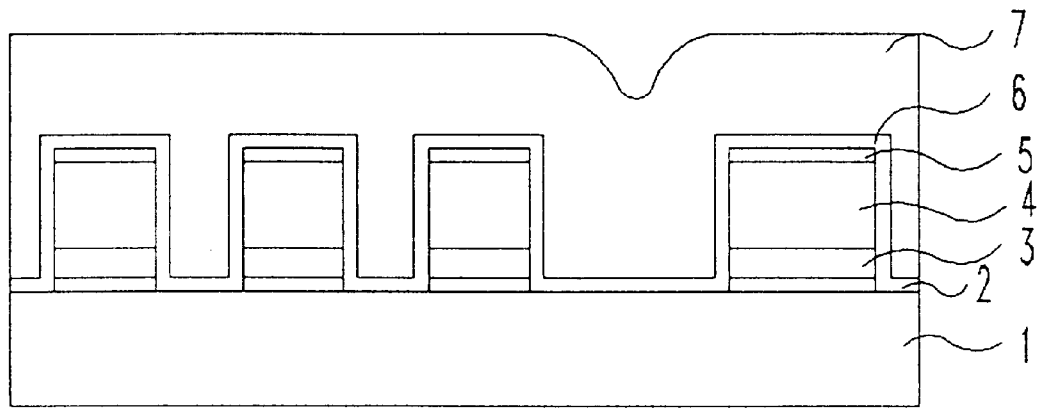

Referring to FIGS. 2A to 2D, a method for forming an insulating film between metal wirings of a semiconductor device in accordance with the present invention is illustrated. For convenience of description, the metal wirings will be described as consisting of tungsten (W). In FIGS. 2A to 2D, elements respectively corresponding to those in FIGS. 1A to 1C are denoted by the same reference numerals.

Figure 2A:
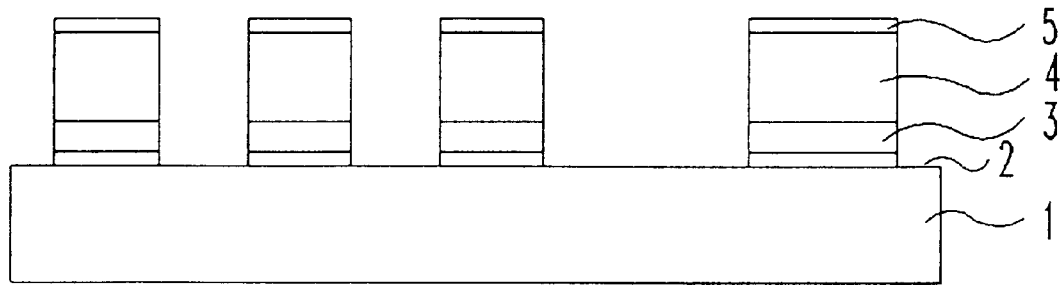
FIGS. 2A to 2D are sectional views respectively illustrating a method for forming an insulating film between metal wirings of a semiconductor device in accordance with the present invention.

In accordance with the method of the present invention, a semiconductor substrate (not shown) comprised of a silicon wafer is first prepared, which is provided with an element-isolating oxide film to define an active region. The semiconductor substrate is also provided with MOS transistors each including a gate electrode and source/drain electrodes. The semiconductor substrate is also provided with capacitors and bit lines. Over the entire surface of the semiconductor substrate, an insulating film 1 made of boro phospho silicate glass (BPSG) is then formed, as shown in FIG. 2A.

On the insulating film 1, a Ti layer 2 and a TiN layer 3 are sequentially formed in accordance with a sputtering method to form a barrier metal layer serving to prevent a spike or impurity diffusion phenomenon occurring in metal wirings which will be subsequently formed. Over the TiN layer 3, a W layer 4 is formed in accordance with the CVD method.

Thereafter, an anti-reflection film 5 made of TiN is formed over the W layer 4 in accordance with the sputtering method. The anti-reflection film 5 serves to prevent an irregular reflection phenomenon occurring when the W layer 4 is subsequently exposed to light for its patterning. The resulting structure is then wet or dry-etched from the anti-reflection film 5 to the Ti layer 2 in a sequential manner in accordance with the well-known photo-etching method, thereby forming metal wirings consisting of the pattern of the anti-reflection film 5, the pattern of the TiN layer 3 and the pattern of the Ti layer 2.

Figure 2B:
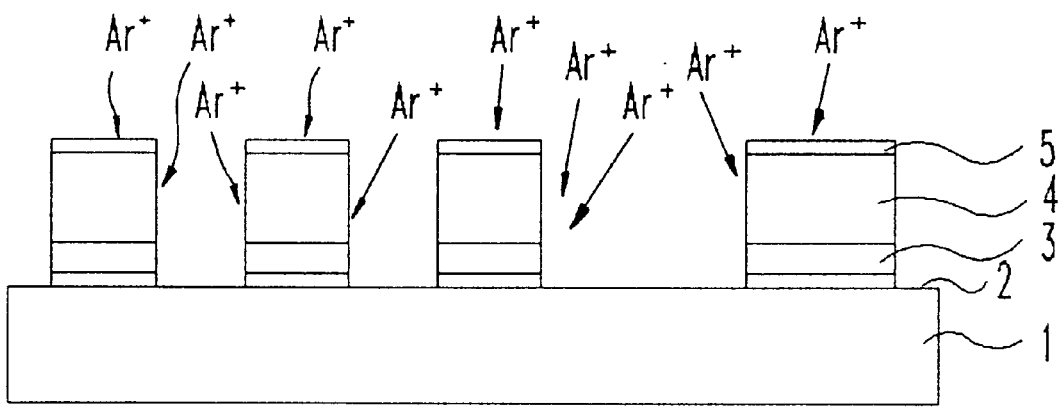

The entire exposed surface of the resulting structure, which includes the exposed surfaces of the anti-reflection film pattern, W layer pattern, TiN layer pattern and Ti layer pattern and insulating film, is treated using Ar plasma, as shown in FIG. 2B. Preferably, the plasma treatment is carried out in a dual frequency manner, namely, using two different frequencies, one being a high frequency and the other being a low frequency. As a result of tests, it was found that when the plasma treatment was carried out using power ranging from 200 to 400 W at high frequency, and power of not less than 50 W at low frequency, at a temperature not less than 25° C. for 10 seconds or more, an $O_3$-TEOS insulating film exhibiting a superior film quality was obtained. The same effect may be obtained when the plasma treatment is carried out using $N_2$ gas plasma in place of Ar plasma.

Figure 2C:
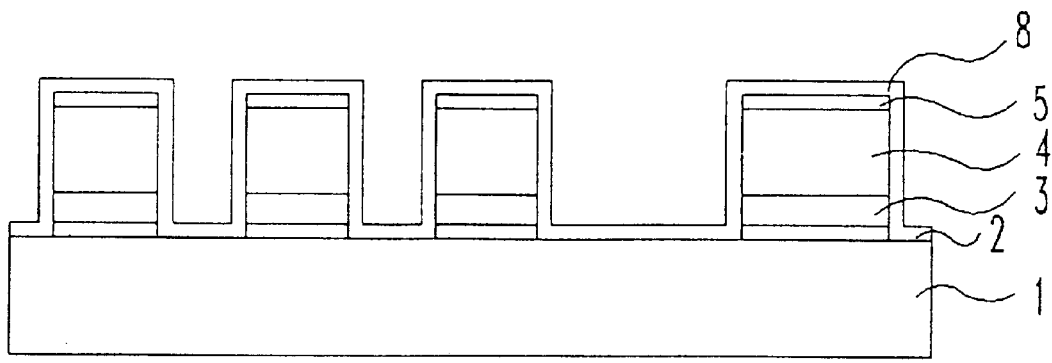

Thereafter, an oxide film 8, which contains Si atoms with a refraction index of 1.47 or above in an excessive amount, is formed to a thickness of 1,000 Å or above using $SiH_4$—$N_2O$ mixed gas in accordance with the PECVD method, as shown in FIG. 2C. As a result of tests, it was found that the quality of layers subsequently formed over the oxide film 8 was improved at a higher refraction index of the oxide film 8. Typical CVD oxide films have a refraction index of about 1.45.

Figure 2D:
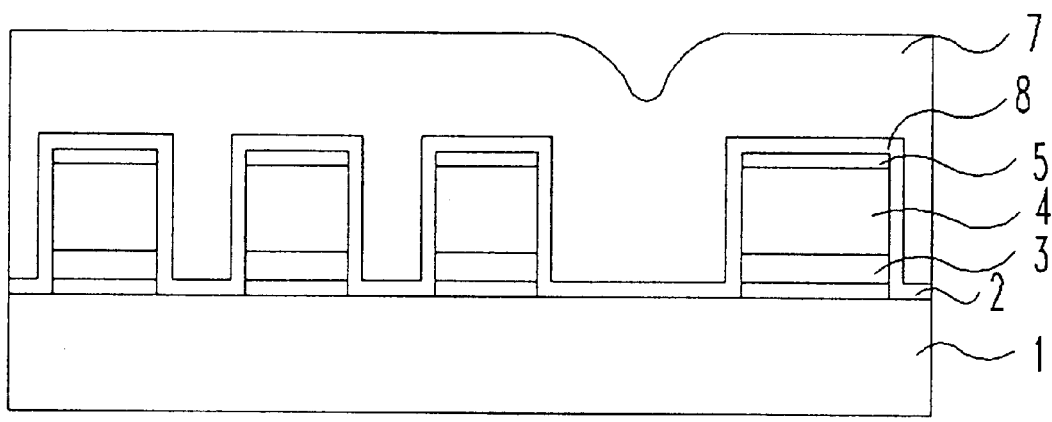

An $O_3$-TEOS film 7 is then formed to a thickness of 5,000 Å over the oxide film 8, as shown in FIG. 2D. The $O_3$-TEOS film 7 is then planarized. Thus, an insulating film between metal wirings is formed.

Although the present invention has been described as forming metal wirings made of tungsten, it can also be applied to the formation of aluminum wirings.

As apparent from the above description, the present invention provides a method for forming metal wirings, which includes the steps of forming over an insulating film a conduction pattern corresponding to metal wirings, which will be subsequently formed, plasma-treating the surface of the resulting structure, forming an oxide film, which contains Si atoms with a refraction index of 1.47 or above in an excessive amount, using $SiH_4$—$N_2O$ mixed gas, and forming an $O_3$-TEOS film over the oxide film. Accordingly, it is possible to prevent a formation of voids in the insulating layer and a degradation in the quality of the insulating layer while achieving a superior reproducibility, an improved yield and an improved reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming an insulating film between metal wiring of a semiconductor device, the method comprising:
    a) forming an insulating film over a semiconductor substrate;
    b) forming metal wiring on said insulating film;
    c) treating said metal wiring with gas plasma, wherein the plasma treatment is carried out:
        1) using Ar plasma;
        2) in a dual frequency manner;
        3) using a power ranging from 200 W to 400 W at a high frequency;
        4) using a power of not lower than 50 W at a low frequency;
        5) at a temperature of not less than 25° C.;
        6) for 10 seconds or more;
    d) forming an oxide film, which contains silicon in an excessive amount, over an entire exposed surface of a resulting surface that is obtained after said plasma treatment; and
    e) forming a second insulating film over said oxide film.

2. The method in accordance with claim 1, wherein the insulating film includes:
an oxide film or a boro phospho silicate glass film formed over the semiconductor substrate.

3. The method in accordance with claim 1, wherein the metal wiring includes:
a barrier metal layer,
a tungsten layer and
an anti-reflective layer.

4. The method in accordance with claim 1, wherein the metal wiring includes:
a barrier metal layer and
an aluminum layer.

5. The method in accordance with claim 1, wherein:
the oxide film containing silicon in an excessive amount has a thickness of not less than 1,000 A.

6. The method in accordance with claim 1, wherein the second insulating film includes:
an $O_3$-tetra ethyl ortho silicate ($O_3$-TEOS) film having a thickness of not less than 5,000 A.

7. The method in accordance with claim 1, wherein the second insulating film formed over the oxide film includes:
an $O_3$-tetra ethyl ortho silicate ($O_3$-TEOS) film.

* * * * *